US00RE40106E

(19) United States
(12) Reissued Patent
den Breejen

(10) Patent Number: US RE40,106 E
(45) Date of Reissued Patent: Feb. 26, 2008

(54) CALIBRATION OF ISOLATED ANALOG-TO-DIGITAL CONVERTERS

(75) Inventor: Frank den Breejen, Abingdon (GB)

(73) Assignee: Cirrus Logic, Inc., Austin, TX (US)

(21) Appl. No.: 10/926,454

(22) Filed: Aug. 26, 2004

Related U.S. Patent Documents

Reissue of:
(64) Patent No.: 6,445,315
Issued: Sep. 3, 2002
Appl. No.: 09/902,712
Filed: Jul. 12, 2001

(51) Int. Cl.
*H03M 1/06* (2006.01)
*H03M 1/10* (2006.01)

(52) U.S. Cl. ..... 341/118; 341/120
(58) Field of Classification Search ..... 341/118, 341/120, 119, 155, 161, 172; 342/420; 324/719
See application file for complete search history.

(56) References Cited

U.S. PATENT DOCUMENTS 4,335,384 A * 6/1982 Roos ..... 342/420
4,894,656 A * 1/1990 Hwang et al. ..... 341/120
5,030,954 A * 7/1991 Ribner ..... 341/172
5,635,937 A * 6/1997 Lim et al. ..... 341/161
5,914,611 A * 6/1999 Cheng ..... 324/719
6,239,732 B1 * 5/2001 Cusey ..... 341/155
6,369,740 B1 * 4/2002 Swanson ..... 341/155

* cited by examiner

*Primary Examiner*—Jean Bruner Jeanglaude
(74) *Attorney, Agent, or Firm*—Robert Platt Bell; Steven A. Lin

(57) ABSTRACT

Measurement data collected by isolated ADCs in multiple channels may be related. In such a scenario, data may be transmitted to a microcontroller or programmable logic device for centralized processing. Gain and offset of the ADCs in different channels, particularly their drift relative to one another, is an issue which requires attention. In particular, a pair of precision resistors is provided in calibrate the different channels. The ADCs may be factory calibrated and the ratio between the two precision resistors stored within the ADCs. The ADCs may later self-calibrate by comparing their relative gains to the stored resistor ratio. Gain of one of the ADCs may be adjusted relative to the other in order to maintain a relative gain calibration. Although absolute gain is not calibrated (as the resistors are isolated) for particular applications, only relative gain between the ADCs is relevant.

33 Claims, 4 Drawing Sheets

CALIBRATION OF ISOLATED ANALOG-TO-DIGITAL CONVERTERS

Matter enclosed in heavy brackets [ ] appears in the original patent but forms no part of this reissue specification; matter printed in italics indicates the additions made by reissue.

CROSS-REFERENCE TO RELATED APPLICATIONS

*The present application in a Reissue Application of U.S. patent application Ser. No. 09/902,712, now U.S. Pat. No. 6,445,315.* The present application contains subject matter related to that in copending U.S. patent application Ser. No. 09/834,630, filed on Apr. 16, 2001, entitled "CAPACITIVELY COUPLED REFERENCES FOR ISOLATED ANALOG-TO-DIGITAL CONVERTER SYSTEMS" and U.S. patent application Ser. No. 09/690,981, filed Oct. 18, 2000, entitled "Providing Power, Clock and Control Signals as a Single Combined Signal Across an Isolation Barrier in an ADC", both of which are incorporated herein by reference.

FIELD OF THE INVENTION

The present invention relates to analog-to-digital converters. In particular, the present invention is directed toward calibration of isolated analog-to-digital converters.

BACKGROUND OF THE INVENTION

Measurement data collected by isolated analog-to-digital converters (ADCs) in multiple data channels may be related. Data from the isolated ADCs may be transmitted to a microcontroller or programmable logic device for centralized processing. The gain and offset of individual channels relative to one another is an issue which may require attention. Such applications are precise, cost-sensitive applications where providing each ADC with a precise reference is not an affordable solution.

ADCs are known to need isolation in applications subject to different voltage levels. The reference voltage of an ADC is not necessary the same as the reference voltage which would be observed by an outside observer (e.g., relative to absolute ground). Moreover, the recording equipment processor used with an ADC may work with another power supply, and the various power supplies may be very different both in voltage levels and in power supply characteristics.

For example, in a power meter chip, used to measure power consumption (e.g., in a residential or business metering or measuring system) with one or three phases, there may be provided a ground line and a live line. The live line may have a potential, for example, 220 Volts from the neutral line. Thus, in order to make a measurement on the ground or neutral line and simultaneously make a measurement on the live line, the ADC front end must be able to accommodate vastly different voltage levels (i.e., the voltage reference to the live line, such as 220 Volts absolute, and a ground reference). The measurement device and the data processor may need to be isolated electrically from one another.

It is known in the art to use isolation capacitors as an isolation barrier in multi-link systems. A transformer or other isolation device may also be used to isolate the ADC from the microcontroller or programmable logic device. However, such isolation barriers may make it difficult to calibrate the ADC since the microcontroller or programmable logic device may have difficulty sending a precise voltage reference signal through the isolation barrier.

FIG. 1 is a block diagram of a measurement system 9 of the prior art. Such measurement systems may be used to measure various analog parameters in environments where voltage isolation is required. For example, in residential power metering, a measurement device (front end) may be measuring power at line voltage (e.g., 220 Volts) and some form of isolation may be required to protect the user and processor (back end) which may be at a much lower potential. Similarly, in medical systems, voltage isolation may be required as a fail-safe to prevent a patient from being electrocuted due to potential differences between various medical monitoring devices connected to a patient.

Referring to FIG. 1, measurement system 9 may include a digital signal processor (DSP) 11, link chip 12, capacitor C1 13, analog-to-digital converter (ADC) and link chip 15, and a sensor 16. Sensor 16 may comprise any one of a number of known analog sensors for measuring a particular parameter (e.g., temperature, pressure, voltage, amperage, power consumption, or the like).

Analog-to-digital converter (ADC) and link chip 15 may convert the analog output of sensor 16 to a digital value (typically a one-bit data stream) and outputs this data stream to a digital signal processor (DSP) 11 via link chip 12 and isolation capacitor 13. In addition to digital data values transmitted from analog-to-digital converter (ADC) and link chip 15 to digital signal processor (DSP) 11, other signals may need to be exchanged between the two chips.

For example, clock signals and control signals (including calibration signals or voltage levels) may be transmitted from digital signal processor (DSP) 11 to analog-to-digital converter (ADC) through link chip 15. In addition, digital signal processor (DSP) 11 may need to provide power supply voltage to analog-to-digital converter through link chip 15. In the prior art, additional signal lines may be required for such additional signals, increasing the complexity and cost of the device.

In many applications it may be necessary to isolate analog-to-digital converter (ADC) from link chip 15 and digital signal processor (DSP) 11 due to differences in voltage potential. An isolating capacitor 13 may be employed to isolate the voltage potential between analog-to-digital converter and link chip 15 and digital signal processor (DSP) 11.

FIG. 2 is a block diagram of another embodiment of a measurement system 19 of the prior art. Measurement system 19 includes a digital application specific integrated circuit (ASIC) or programmable logic device (PLD) 21 such as a digital signal processor and link chip, a resistor 22, capacitor 23, transformer 24, analog-to-digital converter (ADC) 25 and capacitor 26.

ASIC or PLD 21 may include a transmitter 27 and receiver 29 coupled to each other through switch 28. Data may be selectively transmitted and received over the connection between ASIC or PLD 21 and ADC 25. In addition, ASIC or PLD 21 may provide power to ADC 25 through this same link.

ADC 25 may include a diode 30 and a rectifier 31. Signals from secondary winding 33 of transformer 24 may be rectified by rectifier 31 and diode 30 to produce a voltage a capacitor 26 which in turn is the power supply for ADC 25.

As in the embodiment of FIG. 1, transmitter 27 may transmit to primary winding 32 of transformer 24 a square wave which may be partially blocked or distorted by capacitor 23 from transformer 24. ADC 25 may detect a pause during the tri-state operation and takes over the data link, sending data and status back to receiver 29. During this take-over period, however, voltage at power supply 26 may droop significantly if many bits are transmitted, and full logic levels may not re-establish themselves.

In addition, an isolated ADC may require an accurate low noise reference voltage from, for example, a microcontroller. If the ADC is rendered in CMOS, a superqulaity voltage reference may be required for the ADC to accurately measure analog values. CMOS circuitry may be more susceptible to drift due to temperature variations and the like, as well as initial accuracy of measurement.

Further, in order to preform an absolute accurate conversion with an isolated ADC, it may be necessary to send an accurate low noise reference voltage across the isolation barrier. If the ADC is rendered in CMOS, a superquality voltage reference may be required for the ADC to accurately measure analog values. CMOS circuitry may be more susceptable to drift due to temperature variations and the like, as well as initial accuracy of measurement. A better reference, therefore, may be implemented on the isolated side.

Moreover, in some applications, it may be necessary to provide multiple isolated ADCs with precisely matched gains for acquiring related signals such that conversion data are known to be exactly at the same scale. These may be ratiometric measurements between several isolated points. Prior art techniques may use separate chips for each ADC side to provide a reference signal. However, such as solution creates extra cost and increases complexity and size of the overall circuitry.

SUMMARY OF THE INVENTION

Related measurement data collected by isolated analog-to-digital converters in multiple channels may be transmitted to a microprocessor or programmable logic device for centralized processing, to eliminate selected gain and offset effects common to the different analog-to-digital converters in the different channels, eliminating the consequences of drift in the different channels.

In particular, a pair of precision resistors is provided to calibrate the different channels. The ADCs may be factory calibrated and the ratio between the two precision resistors stored within the ADCs. The ADCs may later self-calibrate by comparing their relative gains to the stored resistor ratio. Gain of one of the ADCs may be adjusted relative to the other in order to maintain a relative gain calibration. Although absolute gain is not calibrated (as the resisters are isolated) for particular applications, only relative gain between the ADCs is relevant. Thus, the present invention provides a cost-effective and simple solution to relative gain calibration between isolated ADCs.

The system employs first and second sensors for receiving respective first and second analog signals. The signals from the respective sensors may be converted with respective first and second analog-to-digital converters into counterpart digital signals. Corresponding first and second transformers couple the separate signal streams into a data processing system connected to the first and second transformers, whereby the transformers isolate the data processing systems from the respective analog-to-digital converters.

First and second analog-to-digital converters may be referenced to respective local grounds, which may be at very different potentials. In normal operation, the respective analog-to-digital converters may employ on-chip CMOS bandgap references. These references have relatively high temperature drift and time digital characteristics. Such references may be calibrated with precisely matched inputs from the first and second resistors.

The resistors may be manufactured on a common substrate which features good thermal conduction and electrical insulation characteristics. Chips comprising ADC may be provided with silicon thermal meters. The apparatus may then be subject to a two-temperature factory calibration. The ratio variation of the first and second resistors over temperature and time may be less than 100 ppm.

Since the first and second resistors carry substantially the same current the ADCs do not drawing much current from the first and second resistors, a pair of ratio matched voltages is established with the first and second resistors for the calibration of the CMOS bandgap references in the respective ADCs to the aforementioned desired accuracy level.

DETAILED DESCRIPTION OF THE INVENTION

Figure 1:
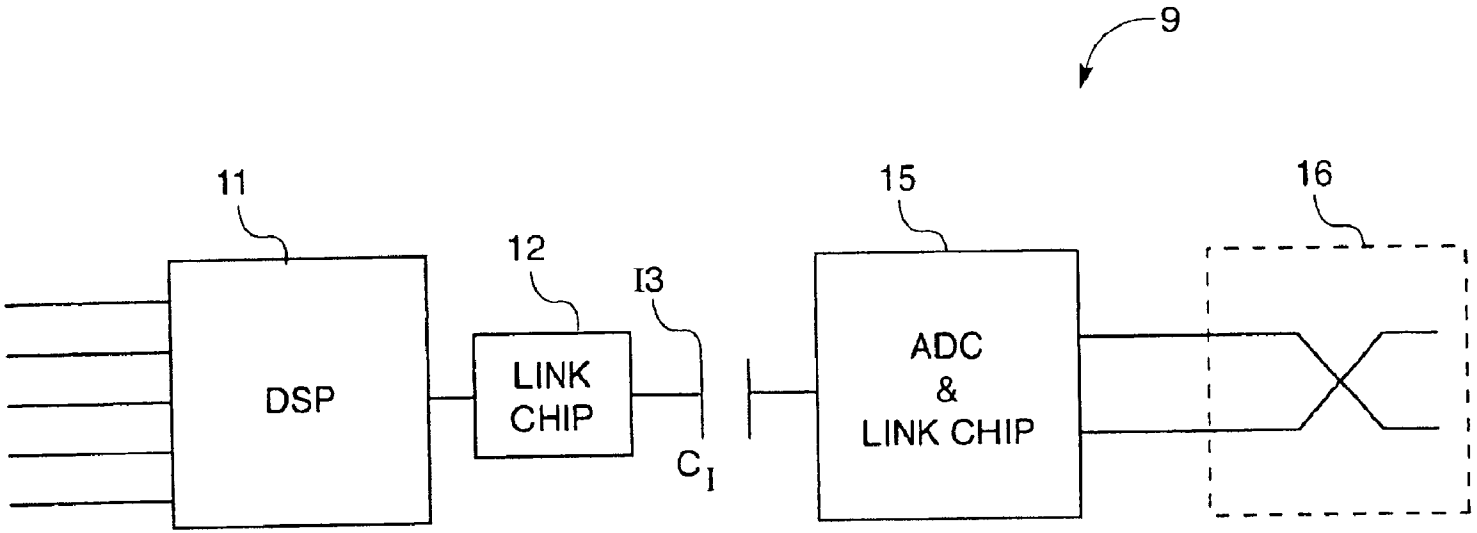
Figure 1 (Prior Art)
FIG. 1 is a block diagram of a measurement system of the prior art.
Figure 2:
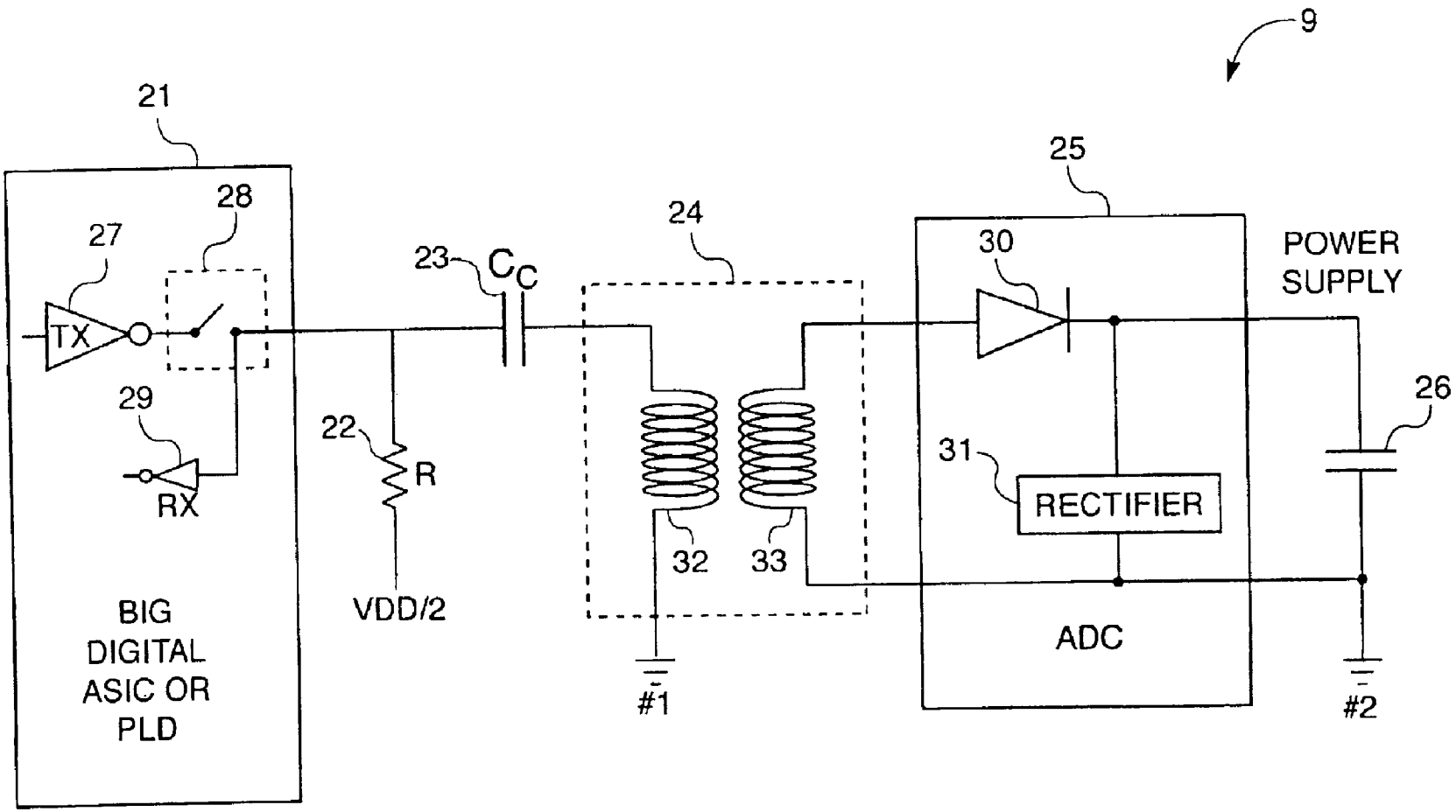
Figure 2 (Prior Art)
FIG. 2 is a block diagram of another embodiment of a measurement system 19 of the prior art.
Figure 3:
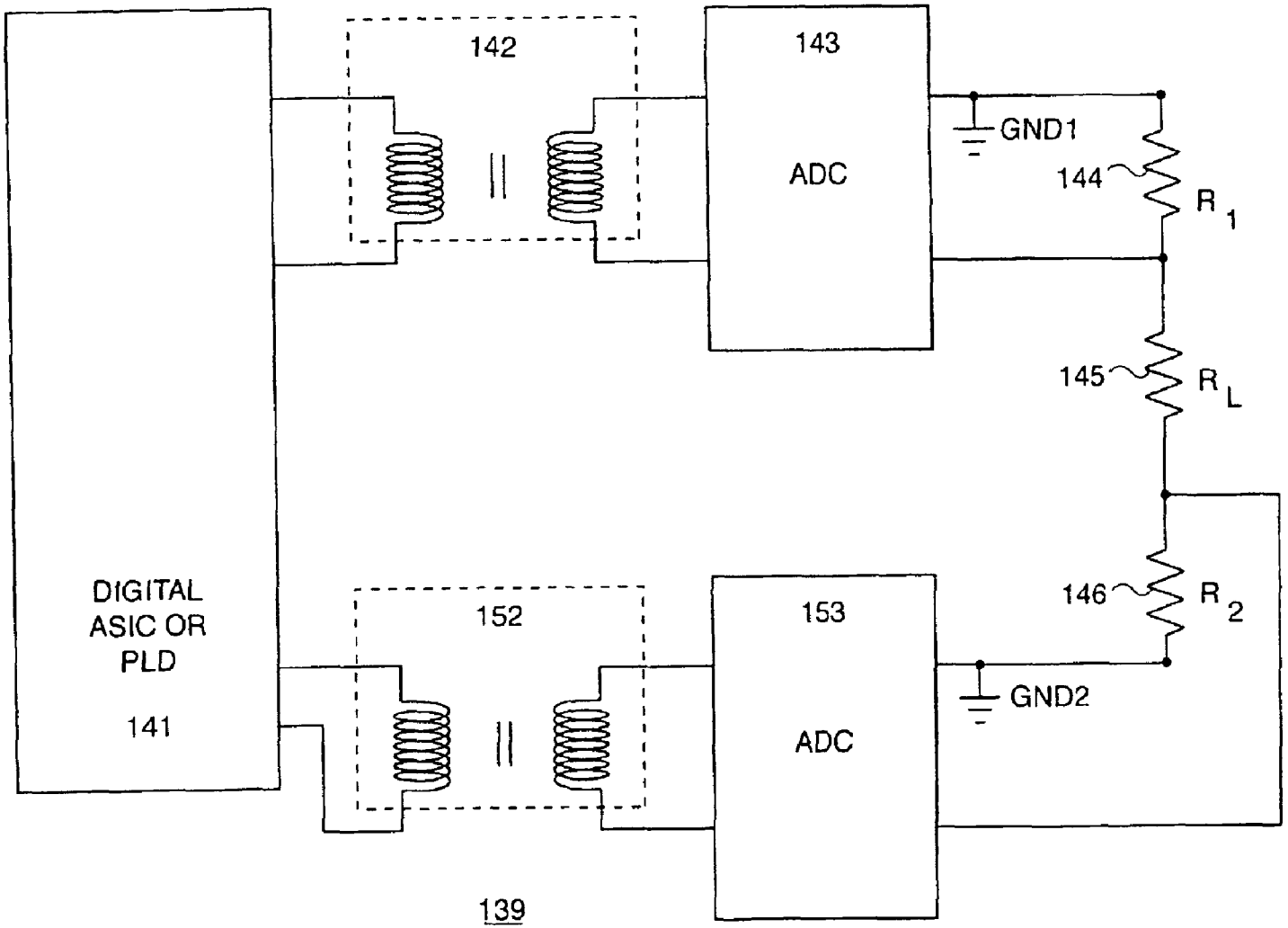
FIG. 3 is a block diagram of a two channel isolated analog-to-digital converter system of the present invention.

Referring now to FIG. 3, there is known a block diagram of a two channel isolated analog-to-digital converter system 139, wherein the analog-to-digital converter 143 and 153 are isolated from the microprocessor or programmable logic device 141 by first and second transformers 142 and 152, respectively.

System 139 includes a microprocessor or programmable logic device 141 which is coupled to first and second analog-to-digital converters 143 and 153 through respective first and second transformers 142 and 152. A current limiting/isolating resistor RL 145 may limit overall current and isolate the two calibration resistors $R_1$, 144 and $R_2$ 146 from one another. First and second calibration resistors $R_1$ 144 and $R_2$ 146 may be coupled to the outputs of analog-to-digital converters 143, and 153, respectively.

First and second analog-to-digital converters 143, and 153 may be referenced to respective local grounds GND1 and GND2, which may be at very different potentials. In normal operation, the respective analog-to-digital converters 143 and 153 may employ on-chip CMOS bandgap references. These references have relatively high temperature drift and time drift characteristics. Such references may be calibrated with precisely matched inputs from first and second resistors 144 and 146.

Resistors 144 and 146 may be manufactured on a common substrate which features good thermal conduction and electrical insulation characteristics. Chips comprising ADCs 143 and 153 may be provided with silicon thermal meters. The apparatus may then be subject to a two-temperature factory calibration. The ratio variation of the first and second resistors over temperature and time may be less than 100 ppm.

Since the first and second resistors carry substantially the same current, with the ADCs not drawing much current from the first and second resistors, a pair of ratio matched voltages is established with the first and second resistors for the calibration of the CMOS bandgap references in the respective ADCs to the aforementioned desired accuracy level. Thus, a low cost alternative for calibrating isolated ADCs in multiple gain channels using multiple precise references is provided.

The present invention has particular application in instances where multiple ADCs must have precisely matched gains. An example of this is a residual current device which is designed to detect a small difference between two almost equally large currents in the "line" (e.g., hot) and neutral wires in an AC power circuit (e.g., ground fault detection and the like). The gains of the ADCs may need to be closely matched, although the absolute gains of the ADCs may not need to be so accurate.

One implementation of such a system is to provide each ADC with a precise reference, which eliminates the bulk of the gain drift of a CMOS ADC. However, such an approach could be expensive. In the present invention, the ADCs may be periodically gain-calibrated with matched input from the pair of matched precision resistors $R_1$ and $R_2$ as set forth above. The relative gains of the two ADCs will thus be closely matched to one another, while the absolute gain may be less relevant.

After initial testing calibration, the gain of the two ADCs are known. The two ADCs measure and record the ratio of $R_1/R_2$. Later, in field operation, the ratio of $R_1/R_2$ is assumed to be unchanged while the gains of the ADCs may have drifted. In a relative gain calibration, the ADCs measure the ratio $R_1/R_2$ again, and any changes in the result is attributed to the gain drift of the ADCs. It may be further assumed that one of the ADCs (e.g., ADC2) is the one that has drifted, and its gain may then be calibrated to match the other ADC. Again, relative gain of one ADC to another may be more important than absolute gain.

While this scheme may not reduce absolute gain error of the ADCs, it does reduce the relative gain error between the ADCs to the drift of the ratio of the precision resistors. Note that any change to the potential of GND2 with respect to GND1 does not affect ratio measurement. The only requirement for the ratio measurement to be accurate is that the ADCs do not draw current from the resistor chain at the instant of sampling.

Figure 4:
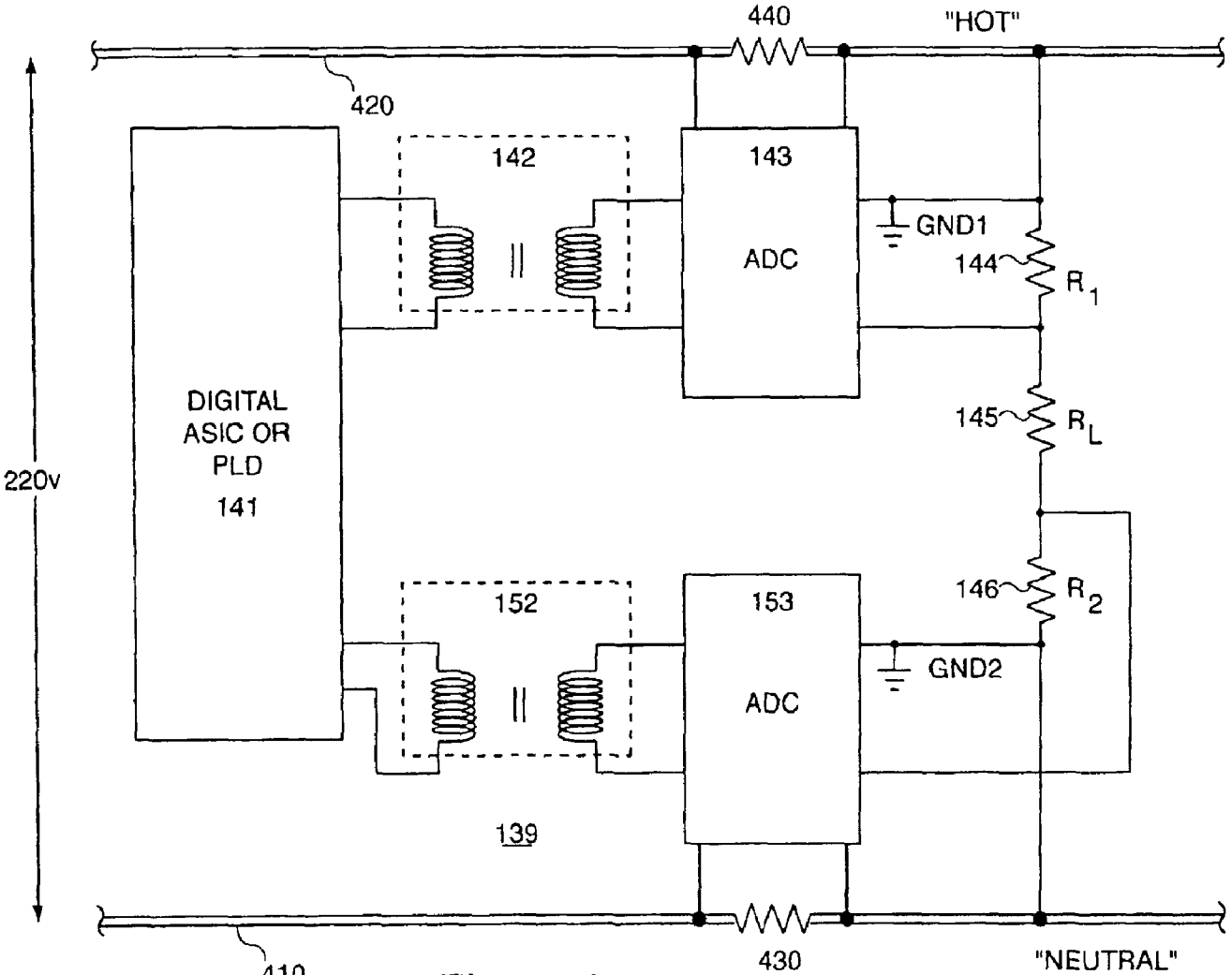
FIG. 4 is a block diagram of a two channel isolated analog-to-digital converter system of the present invention illustrated in a power metering application.

FIG. 4 is a block diagram of a two channel isolated analog-to-digital converter system of the present invention illustrated in a power metering application. In FIG. 4, ADC 143 may measure current through "HOT" 220VAC line 420, for example, by measuring a voltage drop across resistor 440. Similarly, ADC 153 may measure current through "NEUTRAL" 220VAC line 410, for example, by measuring a voltage drop across resistor 430.

As the ADCs 143 and 153 are precisely matched, any difference in detected current can be measured as a ground fault, for example. Note that the absolute gain of the ADCs is irrelevant in such an application, only the relative gains need be precisely matched. Also note that ADC 143 may be tied to "HOT" 220VAC line 420 as a reference "ground", whereas ADC 153 may be tied to "NEUTRAL" 220VAC line 410. Thus, each of ADCs 143, 153 are tied to disparate ground levels. The present invention allows for relative calibration between the ADCs despite the different grounding levels of the ADCs.

While the preferred embodiment and various alternative embodiments of the invention have been disclosed and described in detail herein, it may be apparent to those skilled in the art that various changes in form and detail may be made therein without departing from the spirit and scope thereof.

For example, the invention described herein may be readily extended to more than two ADCs, where one ADC could be assumed to have no gain drift, and all others gain-calibrated with that ADC. For n ADCs, n−1 pairs of precision resistors may be provided.

I claim:

1. An isolated analog-to-digital converter system having at least two channels, said isolated analog-to-digital converter system comprising:

first and second analog-to-digital converters for receiving respective analog input signals and outputting respective digital data signals; and first and second calibration resistors coupled to the respective outputs of the first and second analog-to-digital converters, for use in calibrating relative gain of the first and second analog-to-digital converters wherein relative gain of the first and second analog-to-digital converters is calibrated from the ratio of the resistances of the first and second calibration resistors.

2. The isolated analog-to-digital converter system of claim 1, wherein the first and second analog-to-digital converters each further include:

an on-chip CMOS bandgap reference calibrated with the matched inputs from the first and second calibration resistors, respectively.

3. The isolated analog-to-digital converter system of claim 2, further comprising:

wherein the first and second calibration resistors comprise a pair of matched precision resistors.

4. The isolated analog-to-digital converter system of claim 3, further comprising:

a data receiving device, coupled to the first and second analog converters, for receiving data from the first and second analog-to-digital converters.

5. The isolated analog-to-digital converter system of claim 4, further comprising:

first and second isolation transformers, each coupled between a respective first and second analog-to-digital converter and the data receiving device, for isolating the data receiving device from the first and second analog-to-digital converters.

6. The isolated analog-to-digital converter system of claim 5, further comprising:

a current limiting/isolating resistor, coupled between the first and second analog-to-digital converters, for limiting overall current and isolate the first and second calibrations resistors from one another.

7. The isolated analog-to-digital converter system of claim 6, wherein the first and second analog-to-digital converters are referenced to respective local grounds GND1 and GND2 having independent potentials.

8. The isolated analog-to-digital converter system of claim 7, wherein the first and second calibration resistors are on a common substrate which has good thermal conduction and electrical insulation characteristics.

9. The isolated analog-to-digital converter system of claim 8, wherein each of the first and second analog-to-digital converters are on respective semiconductor chips, each semiconductor chip provided with silicon thermal meters, wherein the isolated analog-to-digital converter system is subject to a two-temperature factory calibration.

10. The isolated analog-to-digital converter system of claim 2, wherein said first and second calibration resistors carry substantially the same current, with the first and second analog-to-digital converters drawing substantially no current from the first and second calibration resistors, such that the first and second calibration resistors provide a pair of ratio matched voltages for the calibration of the CMOS bandgap references in the respective first and second analog-to-digital converters.

11. The isolated analog-to-digital converter system of claim 10, wherein, after initial testing calibration, the gains of the first and second analog-to-digital converters are known, and the first and second analog-to digital converters measure and record the ratio R1/R2 of the first and second calibration resistors to one another such that in field operation with the ratio of R1/R2 assumed to be unchanged, the first and second analog-to-digital converters measure the ratio R1/R2 and gain of one of the first and second analog-to-digital converters is adjusted to match the other of the first and second analog-to-digital converters.

12. A method of automatically calibrating relative gains of an at least two channel isolated analog-to-digital converter system including first and second analog-to-digital converters for receiving respective analog input signals and outputting respective digital data signals, said method comprising the steps of:

providing first and second calibration resistors coupled to the respective outputs of the first and second analog-to-digital converters, respectively, and calibrating relative gain of the first and second analog-to-digital converters from the ratio of the resistances of the first and second calibration resistors.

13. The method of claim 12, wherein the first and second analog-to-digital converters each further include respective on-chip CMOS bandgap references, and said step of calibrating relative gain of the first and second analog-to-digital converters comprises the steps of calibrating the respective CMOS bandgap references with matched inputs from the first and second calibration resistors.

14. The method of claim 13, the step of providing first and second calibration resistors further comprises the step of providing a pair of matched precision resistors.

15. The method of claim 14, further comprising the step of:

receiving, in a data receiving device, coupled to the first and second analog converters, data from the first and second analog-to-digital converters.

16. The method of claim 15, further compiling the step of:

isolating the first and second analog-to-digital converters from the data receiving device, using respective first and second isolation transformers coupled between respective first and second analog-to-digital converters and the data receiving device.

17. The method of claim 16, further comprising the step of:

limiting overall current through the first and second calibration resistors and isolating the first and second calibration resistors from one another by providing a current limiting/isolating resistor, coupled between the first and second analog-to-digital converters.

18. The method of claim 17, wherein the first and second analog-to-digital converters are referenced to respective local grounds GND1 and GND2 having independent potentials.

19. The method of claim 18, wherein the step of providing the first and second calibration resistors further comprises the step of providing the first and second calibration resistors on a common substrate which has good thermal conduction and electrical insulation characteristics.

20. The method of claim 19, wherein each of the first and second analog-to-digital converters are on respective semiconductor chips, each semiconductor chip provided with silicon thermal meters, said method further comprising the step of calibrating the respective gains of the first and second analog-to-digital converters with a two-temperature factory calibration.

21. The method of claim 13, wherein the first and second calibration resistors carry substantially the same current, with the first and second analog-to-digital converters drawing substantially no current from the first and second calibration resistors, such that the first and second calibration resistors provide a pair of ratio matched voltages for the calibration of the CMOS bandgap references in the respective first and second analog-to-digital converters.

22. The method of claim 21, wherein after initial testing calibration, the gains of the first and second along-to-digital converters are known, said method further comprising the steps of:

measuring, using the first and second analog-to-digital converters, the ratio R1/R2 of the first and second calibration resistors to one another, recording, using the first and second analog-to-digital converters, the ratio R1/R2 of the first and second calibration resistors to one another, measuring, using the first and second analog-to-digital converters, in a subsequent filled calibration, assuming the ratio of R1/R2 is unchanged, the ratio R1/R2, and adjusting the gain of one of the first and second analog-to-digital converters to match the other of the first and second analog-to-digital converters.

23. A power measuring system for measuring power current, comprising:

an isolated analog-to-digital converter system having at least two channels, said isolated analog-to-digital converter system comprising:

first and second analog-to-digital converter for receiving respective analog input signals and outputting respective digital data signals; and first and second calibration resistors coupled to the respective outputs of the first and second analog-to-digital converters, for use in calibrating relative gain of the first and second analog-to-digital converters wherein relative gain of the first and second analog-to-digital converters is calibrated from the ratio of the resistances of the first and second calibration resistors.

24. The power measuring system of claim 23, wherein the first and second analog-to-digital converters each further include:

an on-chip CMOS bandgap reference calibrated with the matched inputs from the first and second calibration resistors, respectively.

25. The power measuring system of claim 24, further comprising:

wherein the first and second calibration resistors comprise a pair of matched precision resistors.

26. The power measuring system of claim 25, further comprising:

a data receiving device, coupled to the first and second analog converters, for receiving data from the first and second analog-to-digital converters.

27. The power measuring system of claim 26, further comprising:

first and second isolation transformers, each coupled between a respective first and second analog-to-digital converter and the data receiving device, for isolating the data receiving device from the first and second analog-to-digital converters.

28. The power measuring system of claim 27, further comprising:

a current limiting/isolating resistor, coupled between the first and second analog-to-digital converters, for limiting overall current and isolate the first and second calibrations resistors from one another.

29. The power measuring system of claim 28, wherein the first and second analog-to-digital converters are referenced to respective local ground GND1 and GND2 having independent potentials.

30. The power measuring system of claim 29, wherein the first and second calibration resistors are on a common substrate which has good thermal conduction and electrical insulation characteristics.

31. The power measuring system of claim 30, wherein each of the first and second analog-to-digital converters are on respective semiconductor chips, each semiconductor chip provided with silicon thermal meters, wherein the isolated analog-to-digital converter system is subject to a two-temperature factory calibration.

32. The power measuring system of claim 24, wherein said first and second calibration resistors carry substantially the same current, with the first and second analog-to-digital converters drawing substantially no current from the first and second calibration resistors, such that the first and second calibration resistors provide a pair of ratio matched voltages for the calibration of the CMOS bandgap references in the respective first and second analog-to-digital converters.

33. The power measuring system of claim 32, wherein, after initial testing calibration, the gains of the first and second analog-to-digital converters are known, and the first and second analog-to-digital converters measure and record the ratio R1/R2 of the first and second calibration resistors to one another such that in field operation with the ratio of R1/R2 assumed to be unchanged, the first and second analog-to-digial converters measure the ratio R1/R2 and gain of one of the first and second analog-to-digital converters is adjusted to match the other of the first and second analog-to-digital converters.

* * * * *